United States Patent
Bullock

[11] 3,996,576
[45] Dec. 7, 1976

[54] OPTICAL WAVEGUIDE MAGNETIC BUBBLE DETECTION

[75] Inventor: David Carl Bullock, Richardson, Tex.

[73] Assignee: Texas Instruments Incorporated, Dallas, Tex.

[22] Filed: Mar. 17, 1975

[21] Appl. No.: 559,627

[52] U.S. Cl. ............... 340/174 TF; 340/174 YC; 350/151; 350/96 WG
[51] Int. Cl.² ................ G11C 11/14; G11C 11/42
[58] Field of Search ............ 340/174 TF, 174 YC, 340/174 GB; 350/151, 96 WG

[56] References Cited
UNITED STATES PATENTS

| | | | |
|---|---|---|---|
| 3,830,555 | 8/1974 | Warner | 350/96 WG |
| 3,859,643 | 1/1975 | Borrelli | 340/174 TF |

*Primary Examiner*—James W. Moffitt
*Attorney, Agent, or Firm*—Harold Levine; James T. Comfort; William E. Hiller

[57] ABSTRACT

A magnetic bubble detector utilizing a thin film optical waveguide. Light is optically coupled into the guide for propagation of linearly polarized light along a first axis thereof. Magnetic bubbles from a memory storage location are moved past the sensor on a second axis transverse the first. A sensor is provided for sensing changes in the polarization mode of the light propagating along the axis of the waveguide. The sensor includes an optical device for coupling light out of the waveguide. The passage of a magnetic bubble along the second axis past the waveguide will modulate the polarized light by the fringing field of the bubble and provide a light output signal from the sensor indicating the passage of each bubble.

25 Claims, 6 Drawing Figures

OPTICAL WAVEGUIDE MAGNETIC BUBBLE DETECTION

BACKGROUND OF THE INVENTION

This invention relates to magnetic bubble detection and more particularly to detectors employing an integrated optics waveguide and to bubble detection methods utilizing said waveguides.

While substantial advances have been made in many areas of cylindrical domain or magnetic bubble technology, one of the significant problems remaining is that of accessing bubble memories by providing a readout. Various types of detectors have been developed for reading or detecting magnetic bubbles as they are moved along a predetermined path and past a read position of a magnetic domain memory. These detectors provide a discrete output signal indicative of the passage of a bubble by the read position. The majority of such detection systems have utilized various magnetoresistive elements, usually formed of a pattern of magnetically soft overlay material, to electrically sense the flux field of the bubble and thereby provide an electrical signal. Such detectors may be satisfactorily fabricated and provide a generally acceptable signal-to-noise ratio, but it would be desirable to be able to provide a detector with an enhanced signal-to-noise ratio. Moreover, these detectors require electronic detector elements and their leads to be placed on the memory chip, all of which diminishes the space available for memory storage on the chip.

The presence of magnetic bubbles in typical magnetic-bubble garnet layers has also been sensed or detected optically but, because of the precise alignment requirements of the optics relative to the detection area and the difficulty in economically fabricating such optical arrangements, progress has been slow in this area and optical methods have hitherto appeared unsuitable in a practical sense.

SUMMARY OF THE INVENTION

Among the several objects of this invention may be noted the provision of magnetic bubble detectors utilizing integrated optics which permit separation of optical and electronic functions of the detection system; the provision of such detectors which permit close spacing of detection regions on bubble memory chips and avoid the placement of electronic elements of the detector system on these chips; the provision of magnetic bubble detectors and methods of bubble detection which reliably sense the presence of a bubble and supply an output signal of improved magnitude at enhanced signal-to-noise ratios; and the provision of such detectors which may be fabricated using existing technology.

Briefly, a magnetic bubble detector of this invention comprises a thin film optical waveguide for the propagation of linearly polarized light along a first axis. Means are provided for coupling light into said guide for propagation along the length thereof as well as for moving magnetic bubbles from a memory storage location past the waveguide on a second axis transverse the first. Means are also provided for sensing changes in the polarization mode of the light propagating along the axis of the waveguide. The sensing means includes means for coupling light out of said waveguide whereby the passage of a magnetic bubble along the second axis past the waveguide will modulate the polarized light by the fringing field of said bubble and provide a light output signal from the sensing means indicating the passage of each bubble.

In accordance with the present invention, the presence of magnetic bubbles is detected by coupling light into a thin film optical waveguide for propagation of linearly polarized light along the longitudinal axis thereof. Magnetic bubbles are moved from a memory storage location past the waveguide on a second axis transverse the aforementioned waveguide axis. Changes in the polarization mode of the light propagating along the axis of the waveguide caused by the fringing field of said bubble are sensed. The thus modulated polarized light is coupled out of said waveguide to provide a light output signal indicating the passage of each bubble.

Other objects and features of the invention will be in part apparent and in part pointed out hereinafter.

BRIEF DESCRIPTION OF THE DRAWINGS

Corresponding reference characters indicate corresponding parts throughout the several views of the drawings.

DESCRIPTION OF PREFERRED EMBODIMENTS

Figure 1:
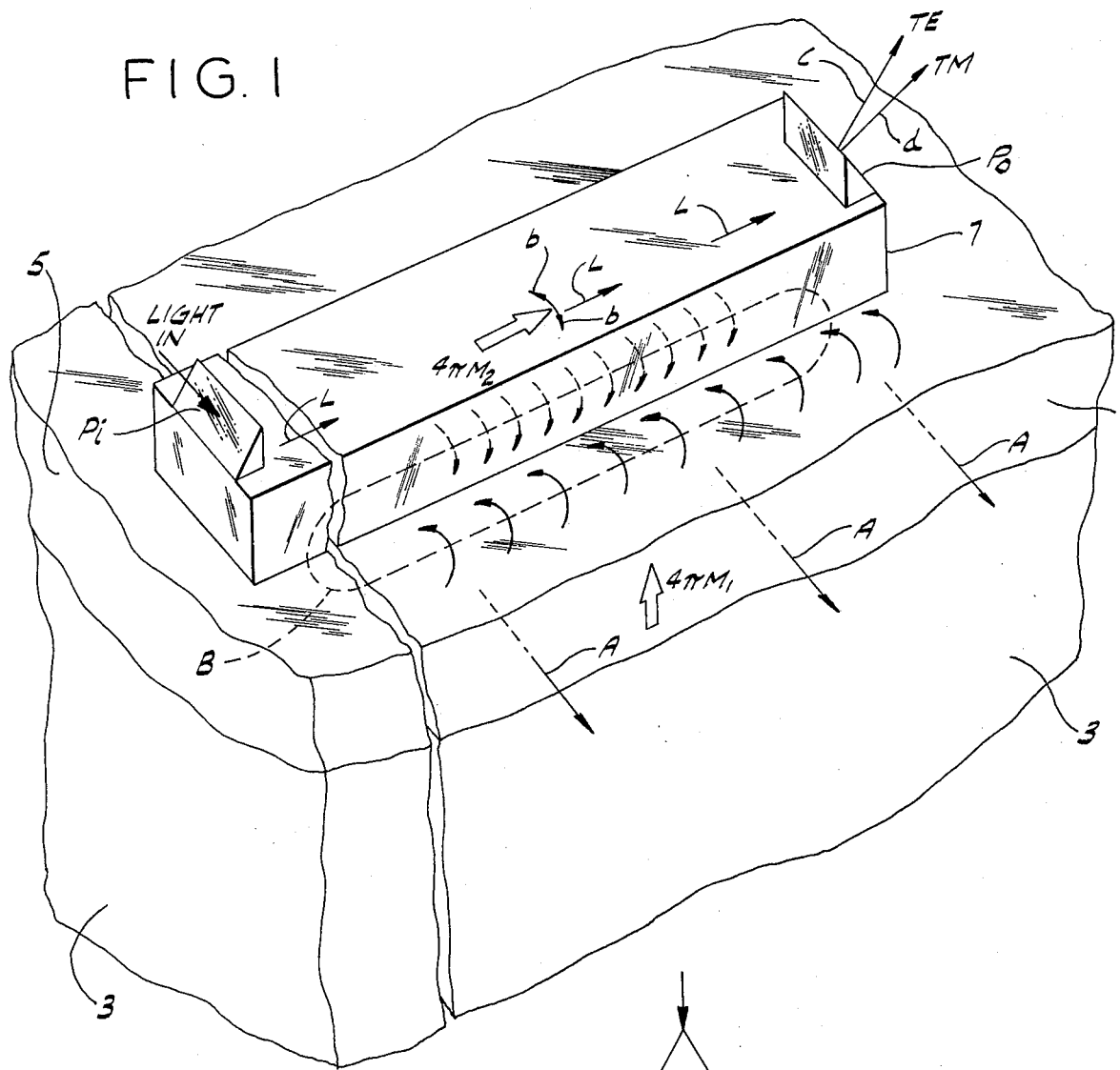
FIG. 1 is a trimetric view on a greatly enlarged scale of a magnetic bubble detector of the present invention and illustrates diagrammatically a bubble detection method of the present invention.

Referring now to the drawings, and more particularly to FIG. 1, a magnetic bubble detector of this invention is indicated generally at 1. It is formed on the surface of a chip of a typical cylindrical magnetic domain material, such as an oriented slice cut from a sigle crystal of rare earth garnet, e.g., gadolinium-gallium garnet, constituting a nonmagnetic substrate portion 3 with a magnetic garnet planar layer 5 possessing uniaxial anisotropy and usually formed by epitaxial deposition on substrate 3. This layer has an easy direction of magnetization perpendicular to the plane of the layer as indicated by the upwardly directed arrow and $4\pi M_1$. A typical magnetic garnet material for the propagation of bubbles is samarium garnet, $Y_{2.6}Sm_{0.4}Fe_{3.9}Ga_{1.1}O_{12}$. This layer constitutes a bubble propagation layer or film and has a thickness, for example, of about 4 to 5 microns for the propagation of magnetic bubbles having a nominal size of about 5 microns. The index of refraction of layer 5 is preferably greater than that of substrate 1.

A planar film 7 constitutes the upper region of the chip and may be either an epitaxial layer depostited on the surface of layer 5 or, as will be described hereinafter, a planar film formed by ion implantation in the exposed surface of layer 5. In either instance, film 7 has an easy direction of magnetization in the plane of the film as indicated by the arrow and $4\pi M_2$, and has an index of refraction that is greater than that of layer 5. A typical epitaxially deposited film 7 has a composition $Y_{2.4}Gd_{0.6}Fe_5O_{12}$, and is about 1 micron thick.

Coherent light, such as that generated by a helium-neon laser with a wavelength of 1.5 microns, is optically coupled into the film by means of a prism Pi as indicated in FIG. 1, with the angle of incidence of the polarized light, either TM (transverse magnetic) mode or TE (transverse electric) mode, selected in accordance with the optical parameters. As film 7 is of magneto-optical material and has a refractive index that is greater than that of layer 5 and the surrounding medium (e.g., air), it will serve as a waveguide with plane or linearly polarized light L propagating along a lengthwise axis thereof as illustrated. Film 7 also functions to suppress hard bubbles.

Figure 2:
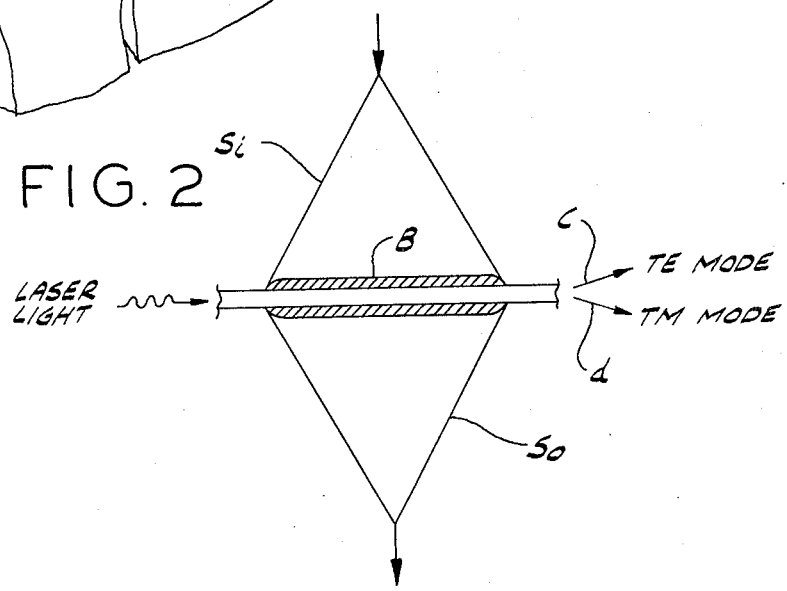
FIG. 2 is a diagrammatic plan view of the magnetic bubble detector of FIG. 1.

Detector 1 is positioned on the bubble chip surface so that the axis of the light propagating in film 7 is transverse to the direction of bubble movement along a bubble path or circuit (not shown) such as is customarily used for memory loops or other registers of a magnetic bubble memory organization. Preferably the bubbles, as they are moved in layer 5 by the customary rotating in-plane magnetic drive field, are stretched by any of the conventional bubble elongation schemes in a direction transverse their direction of movement (as indicated by arrows $a$), i.e., parallel to the axis of light propagation in waveguide film 7. A typical stretcher is formed by a series of parallel rows of chevron-shaped circuit elements of soft magnetic material with the lengths of each successive row increasing in the direction of bubble movement toward the axis of light propagation and decreasing in length as the bubble moves away therefrom. This is diagrammatically represented in FIG. 2 by the generally diamond-shaped-in-plan pattern outline with Si indicating the input portion of the domain expander or stretcher and So indicating the output portion. A stretched or expanded magnetic bubble or strip domain is indicated at B as it moves under the light path in the waveguide. The curved arrows in FIG. 1 represent the fringing magnetic field of the elongate bubble. The passage of a bubble transverse to the direction of light propagation will change the direction of magnetization in film 7, as indicated by arrows $b$ in FIG. 1 so as to tilt or rotate the direction of magnetization in the guide from parallel to the axis of light propagation to perpendicular to it first in one direction $b$ as the leading part of the fringing field of the stretched bubble passes under the waveguide and then again as the trailing part of the fringing field passes thereunder. Since the index of refraction of the guide is a function of the magnitude and direction of magnetization $4\pi M_2$, The fringing field of the bubble B will perturb and interact with the light modes in the waveguide to effect mode switching or modulation of the polarized light. A TM wave or mode, for example, may thus be changed or converted into a TE wave. With no bubble present the waveguide demagnetizing field insures that the direction of magnetization $4\pi M_2$ remains parallel to the light axis and little or no mode conversion takes place. As the direction of magnetization $4\pi M_2$ is affected by the usual inplane drive field for bubble propagation, its effects will have to be suppressed or compensated by appropriate design of bubble and drive fields and arrangement geometry.

The polarized light L thus modulated is coupled out of the film 7 by a prism Po. As is also true of input coupling prism Pi, Po is preferably made of an anisotropic crystalline or birefringent material, such as rutile. For bubbles having a nominal size of say 5 microns the length of the guide from $P_1$ to $P_2$ may be about 0.1 to 0.25 cm. and the domain is preferably stretched to at least a substantial portion of that length. For any particular light polarization mode in the film, there will be a distinct film propagation constant. Also there will be different indices of refraction for such prisms for different light polarization modes. As a result, when the modulated light is coupled out of film 7 by prism Po, the direction of the emerging light of one polarization mode will be deflected relative to the angle of emergence of light of the other polarization mode. Thus light of different polarization modes is differentially coupled out of the guide to provide two light beams, the relative intensities of which are functions of the changes in the polarization mode of the light propagating in the guide effected by the fringing field of a bubble moving therepast. For example, as indicated by arrows $c$ and $d$ in FIGS. 1 and 2, TE light waves emerge at an angle greater by, say, 20° than that at which TM light emerges. As the passage of a bubble by the light propagation path effects mode conversion of the propagating light in the guide and the resultant deflection of the light coupled out of it, a light output signal is produced which indicates the passage of each bubble. The output coupler functions, therefore, to effect a sensing of bubble-induced changes in the polarization mode of the light propagating in the guide and thus serves as a detector.

The light output signal may be selectively transmitted to a light responsive sensor unit such as a germanium avalanche detector which will produce an electrical signal in response to the light signal received. As this light sensor may be positioned at a location remote from the chip no electrical leads or connections need be provided for this purpose on the chip. Similarly the light output signal beam may be directed to another chip for direct control utilization there.

It will be understood while the magnetic bubbles to be detected are preferably stretched to improve the signal amplitude, they may be detected by passage of the normal size bubble by the light guide. Also, although it is advantageous to utilize the film 7 as a light waveguide, the properties of layer 5 are such that it may be used as a light guide and film 7 omitted.

Figure 3:
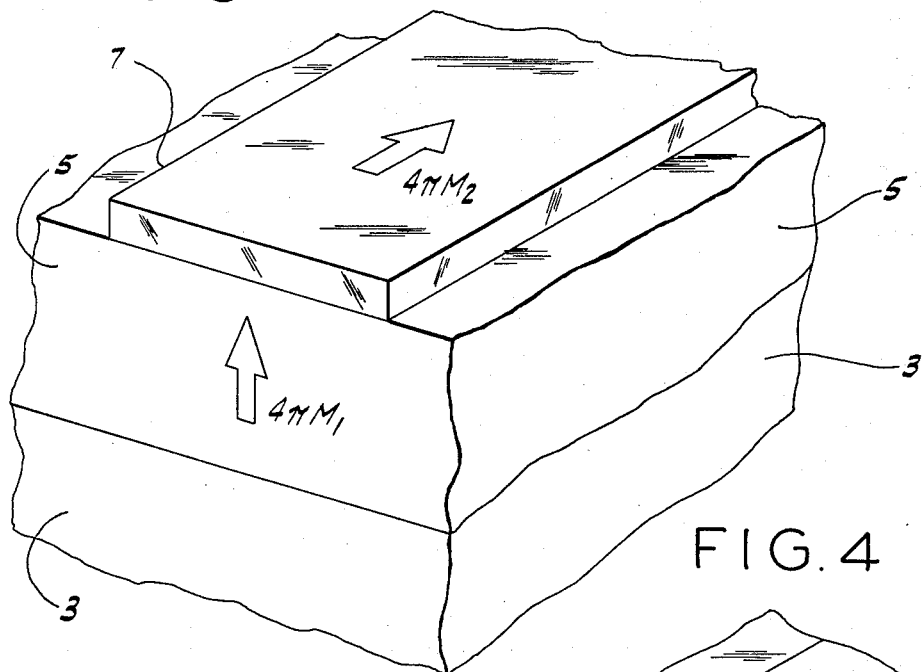
FIGS. 3 and 4 are diagrammatic representations of cross sections through waveguides of detectors of this invention illustrating two different embodiments thereof.

As noted previously and illustrated in FIG. 3, the film 7 may be formed as a separate layer. This is accomplished by utilizing electron beam processing to form the desired light guide pattern, metal masking and ion milling to ensure good edge definition on the guide, all techniques well-known to those in the integrated circuit art.

Figure 4:
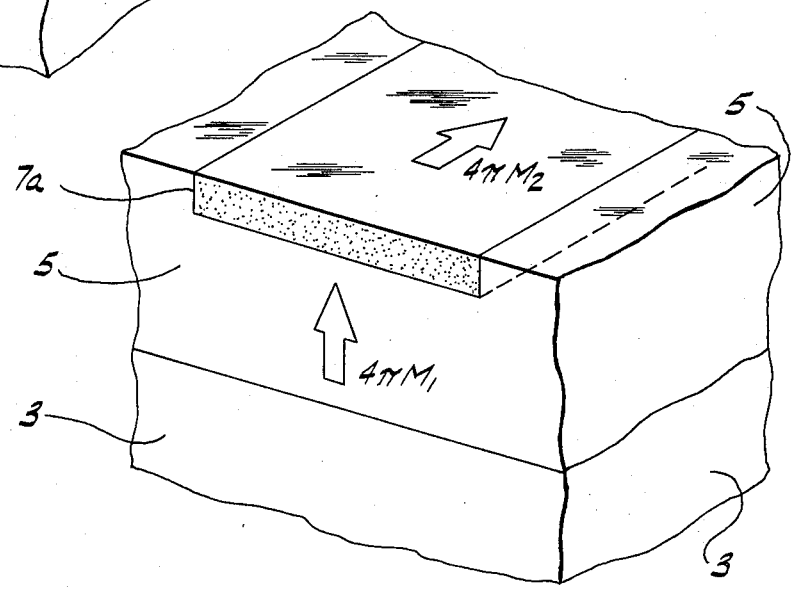

Alternatively the waveguide film may be formed in an exposed surface of the bubble layer 5 by ion implantation techniques, also familiar to those in the integrated circuit art. Such an ion implanted layer 7a is illustrated in FIG. 4. Typically, hydrogen, neon or argon ions of an energy level of 100–200 kEv are directed at the surface of the bubble layer 5 which is appropriately masked except over the region which is to be implanted and serve as the light guide. The bombarding ions cause a local expansion in the surface region of layer 5 to effect a lateral compression which alters the crystal lattice structure changing both the magnetic properties (so that the total anisotropy is overcome and the direction of easy magnetization will be in the plane on the layer) and also the refractive index. Such an implanted film 7a is typically about 0.5 to 1 micron deep for use in detection of magnetic bubbles having a nominal 5 micron diameter. It will be understood, however, that the magnetic domain detectors and detection methods are well adapted for use with submicron size bubbles.

Figure 5:
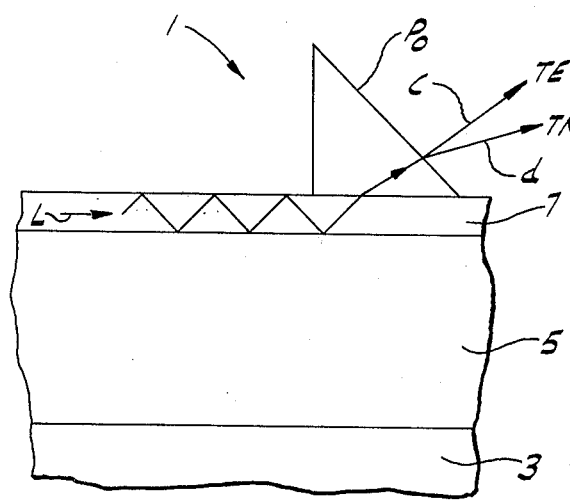
FIG. 5 diagrammatically illustrates a section through a bubble chip utilizing a prism to couple light out of the waveguide component of a detector of this invention.
Figure 6:
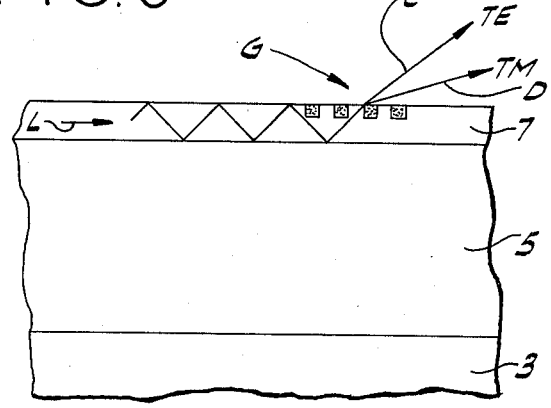
FIG. 6 is diagrammatically illustrates a section through a bubble chip utilizing an optical grating to couple light out of the waveguide component of a detector of this invention.

The use of a prism Po to couple the light modes out of the waveguide as discussed above is illustrated in more detail in FIG. 5. FIG. 6 illustrates another means for coupling light out of the waveguide. There an optical grating G is formed by ion implanting techniques as described above to form a series of parallel spaced rows of ion-implanted stripes, the spacing being a function of the wavelength of light being propagated and the waveguide propagation constant. An exemplary optical grating G was formed by exposing photoresist to a 4880A interferometer fringe pattern, removing the unexposed resist and then ion-implanting the exposed areas to form the implanted stripes with a 0.77 micron spacing (center-to-center) period where the wavelength of the laser light was 1.15 microns and the normalized waveguide propagation constant was 2.2. Alternatively an optical grating may be formed by metallic deposition of the stripes again using conventional masking and deposition techniques so widely used in integrated circuit technology.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A magnetic bubble detector comprising:
a planar layer of magnetic material in which magnetic bubble domains can be moved and having a magnetization perpendicular to the plane of the film;
a thin planar film on one surface of said planar layer of magnetic material and having a magnetization in the plane of the film at least said thin film defining an optical waveguide for the propagation of linearly polarized light along an axis of the waveguide;
means for coupling linearly polarized light into said waveguide and
means for sensing changes in the polarization mode of the light propagating along the axis of the waveguide, the sensing means including means for coupling light out of said waveguide whereby the movement of a magnetic bubble domain in the layer of magnetic material past said waveguide along a path intersecting with the waveguide and transverse to the axis thereof will modulate the polarized light propagating along the axis of the waveguide by the fringing field of the magnetic bubble domain so as to provide a light output signal from the sensing means therby indicating the passage of a magnetic bubble domain.

2. A detector as set forth in claim 1 in which the waveguide is constituted by said planar film, and said planar film and said planar layer of magnetic material having different indices of reefraction.

3. A detector as set forth in claim 2 in which said planar film is overlaid on the surface of said planar layer of magnetic material and projects outwardly therefrom.

4. A detector as set forth in claim 3 in which said planar film comprises an epitaxial film.

5. A detector as set forth in claim 2 in which said planar film is formed in an exposed surface of said planar layer of magnetic material.

6. A detector as set forth in claim 5 wherein said planar film is an ion-implanted film.

7. A detector as set forth in claim 1 which further includes means for stretching magnetic bubble domains in a direcion transverse to their direction of movement as they are moved in the layer of magnetic material past the waveguide along a path intersecting with said waveguide and transverse to the axis thereof.

8. A detector as set forth in claim 1 wherein the means for coupling light out of the waveguide if responsive to the polarization of light being coupled therethrough thereby to cause light of different polarization modes to emerge at different angles.

9. A detector as set forth in claim 8 in which the means for coupling light both into and out of the waveguide comprise birefringent prisms.

10. A detector as set forth in claim 8 in which at least the means for coupling light out of the waveguide comprises an optical grating.

11. A detector as set forth in claim 8 which further includes means responsive to the light output signal emerging from said output light coupling means at a preselected angle to provide an electrical signal indicative of the passage of a magnetic bubble domain.

12. A detector as set forth in claim 11 in which the means responsive to the light output signal is a germanium avalanche detector.

13. A magnetic bubble detector comprising:
a planar layer of magnetic material in which magnetic bubble domains can be moved and having a magnetization perpendicular to the plane of the layer;
a planar film on one surface of said layer and having a magnetization in the plane of the film;
means for coupling light into and out of said film for propagation of linearly polarized light at least through said film along an axis thereof; and
means for stretching magnetic bubble domains in a direction transverse to their direction of movement as they are moved in the layer of magnetic material past the film along a path intersecting with said film and transverse to the axis thereof whereby the fringing field of the stretched magnetic bubble domain modulates the polarized light propagating along the axis of the film and effects a deflection of the light coupled out of the film thereby indicating the passage of a magnetic bubble domain.

14. A detector as set forth in claim 13 in which said planar layer of magnetic material and said planar film have different indices of refraction and wherein the planar film constitutes an optical waveguide and the linearly polarized light is propagated through that film.

15. A detector as set forth in claim 14 in which said planar film has a greater index of refraction than that of said planar layer of magnetic material.

16. A detector as set forth in claim 15 in which said planar film is overlaid on the surface of said planar layer of magnetic material and projects outwardly therefrom.

17. A detector as set forth in claim 16 wherein said planar film comprises an epitaxial film.

18. A detector as set forth in claim 17 wherein said planar layer of magnetic material is constituted by a magnetic surface layer of a garnet chip and said planar film is a magnetic garnet film epitaxially deposited on said layer.

19. A detector as set forth in claim 15 wherein said planar film is formed in an exposed surface of said planar layer of magnetic material.

20. A detector as set forth in claim 19 wherein said planar film is an ion-implanted film.

21. A detector as set forth in claim 20 wherein said planar layer of magnetic material constitutes a magnetic surface layer of a garnet chip and said planar film is formed by ion implantation in said layer.

22. A detector as set forth in claim 15 in which the means for coupling light both into and out of said planar film are birefringent prism couplers.

23. A detector as set forth in claim 15 in which at least the means for coupling light out of said planar film is an optical grating.

24. A detector as set forth in claim 13 which further includes means responsive to the deflected light emerging from said output light coupling means at a preselected angle to provide an electrical signal indicative of the passage of a magnetic bubble domain.

25. A detector as set forth in claim 24 in which the means responsive to the deflected light emerging from said output light coupling means is a germanium avalanche detector.

* * * * *